US009963303B2

(12) United States Patent
Mizuno et al.

(10) Patent No.: US 9,963,303 B2
(45) Date of Patent: May 8, 2018

(54) CASSETTE-TYPE NOZZLE EXCHANGING UNIT AND REPLACEMENT SYSTEM THEREOF

(71) Applicant: FUJI MACHINE MFG. CO., LTD., Chiryu (JP)

(72) Inventors: Takayuki Mizuno, Okazaki (JP); Hidetoshi Ito, Okazaki (JP); Masahiro Kondo, Kasugai (JP); Hidetoshi Kawai, Chiryu (JP); Keita Tanaka, Takahama (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 366 days.

(21) Appl. No.: 14/891,750

(22) PCT Filed: May 21, 2013

(86) PCT No.: PCT/JP2013/064131
§ 371 (c)(1),
(2) Date: Nov. 17, 2015

(87) PCT Pub. No.: WO2014/188520
PCT Pub. Date: Nov. 27, 2014

(65) Prior Publication Data
US 2016/0114987 A1    Apr. 28, 2016

(51) Int. Cl.
*B65G 47/90* (2006.01)
*H05K 13/04* (2006.01)
*H05K 13/00* (2006.01)

(52) U.S. Cl.
CPC ......... *B65G 47/90* (2013.01); *H05K 13/0408* (2013.01); *H05K 13/0084* (2013.01); *Y10T 29/5155* (2015.01); *Y10T 29/53191* (2015.01)

(58) Field of Classification Search
CPC .......... H05K 13/0015; H05K 13/0084; H05K 13/02; H05K 13/04; H05K 13/0404;
(Continued)

(56) References Cited

U.S. PATENT DOCUMENTS 4,505,020 A * 3/1985 Kinoshita .............. B23Q 3/155
29/26 A
6,735,856 B1 * 5/2004 Kitamura ........... H05K 13/0408
29/703

FOREIGN PATENT DOCUMENTS

JP    2004-158640 A    6/2004
JP       4031107 B2    1/2008
JP    2010-135757 A    6/2010

OTHER PUBLICATIONS

Extended European Search Report dated Apr. 26, 2016 in Patent Application No. 13885040.9.
(Continued)

Primary Examiner — Peter DungBa Vo
Assistant Examiner — Joshua D Anderson
(74) Attorney, Agent, or Firm — Oblon, McClelland, Maier & Neustadt, L.L.P.

(57) ABSTRACT

A revolving nozzle station and a revolving drive device that revolves the revolving nozzle station are housed inside a cassette case of a cassette-type nozzle exchanging unit. In an outer circumferential portion of the revolving nozzle station, multiple nozzles for exchange with a nozzle of component mounter are arranged radially along a revolution path, and the nozzles are held in a detachable manner. A nozzle exchange port is formed in a top end surface of cassette case, and nozzle exchange is performed between the revolving nozzle station and a mounting head of the component mounter through the nozzle exchange port. A shutter mechanism which opens and closes the nozzle exchange port is provided in the cassette case.

7 Claims, 16 Drawing Sheets

(58) Field of Classification Search
CPC ........... H05K 13/0408; H05K 13/0417; H05K
13/043; Y10T 29/53174; Y10T 29/53178;
Y10T 29/53191; Y10T 29/53261; Y10T
29/53265; Y10T 29/53539; Y10T
29/5154; Y10T 29/5155; Y10T 29/5168;
B65G 17/32; B65G 17/323; B65G
17/326; B65G 47/84; B65G 47/841;
B65G 47/842; B65G 47/846; B65G
47/847; B65G 47/90; B65G 47/901;
B65G 47/902; B65G 47/904; B65G 47/91
USPC ....................... 414/227.07, 752.1; 221/76, 79
See application file for complete search history.

(56) References Cited

OTHER PUBLICATIONS

Combined Office Action and Search Report dated Sep. 29, 2017 in Chinese Patent Application No. 201380776770.8 (with English translation of Office Action and English translation of categories of cited documents).
International Search Report dated Jun. 25, 2013 in PCT/JP2013/064131 filed May 21, 2013.

* cited by examiner

Clamped position

Unclamped position

CASSETTE-TYPE NOZZLE EXCHANGING UNIT AND REPLACEMENT SYSTEM THEREOF

TECHNICAL FIELD

The present disclosure relates to a cassette-type nozzle exchanging unit in which a nozzle station that performs nozzle exchange for a component mounter takes the form of a cassette, and a replacement system thereof.

BACKGROUND ART

In component mounters, since it is necessary to exchange nozzles that pick up a component which is supplied by a feeder according to the type (size, shape, and the like) of the component, a nozzle station (nozzle storage location) in which multiple nozzles for exchange are arranged is installed inside the component mounter, and a mounting head of the component mounter is moved above the nozzle station in order to perform nozzle exchange. In conventional nozzle stations, since multiple nozzles are arranged lined up in a planar manner in one row or multiple rows, there are demerits in that when the number of nozzles which are arranged becomes great, the area of the nozzle station becomes large, meaning the size of the component mounter needs to be increased, and the distance over which the mounting head is moved in XY directions (horizontal directions) above the nozzle station during the nozzle exchange becomes long, meaning the work efficiency of nozzle exchange is reduced.

Therefore, in PTL 1 (JP-A-2004-158640), multiple nozzles are detachably held and arranged radially on a rotary nozzle station (a hexagonal nozzle holder); the rotary nozzle station is configured to rotate vertically with the center thereof facing horizontally, and, during nozzle exchange, the rotary nozzle station is rotated vertically such that the nozzle which is positioned on a topmost portion of the rotary nozzle station is held by a mounting head of a component mounter.

In PTL 2 (Japanese Patent No. 4031107), a nozzle station in which multiple nozzles are arranged in one row is set, in a detachable manner, in a vacant space of a feeder setting section of a component mounter, and a mounting head of the component mounter is moved above the nozzle station to perform nozzle exchange.

CITATION LIST

Patent Literature

PTL 1: JP-A-2004-158640
PTL 2: Japanese Patent No. 4031107

SUMMARY

Technical Problem

However, in PTL 1, since the rotary nozzle station is attached inside the component mounter, there is a demerit in that the work of exchanging the rotary nozzle station takes time, thus reducing the operating ratio of the component mounter.

Meanwhile, in PTL 2, since the nozzle station is set in a vacant space of the feeder setting section of the component mounter, although there is a merit in that it is possible to exchange the nozzle station with simple work similar to the exchange work of a feeder, the following demerit applies.

In PTL 2, since the nozzle station and the feeder are set adjacent to each other in the feeder setting section of the component mounter, when the mounting head is moved above the nozzle station during nozzle exchange, the mounting head may interfere with a feeder which is adjacent to the nozzle station. Since the movable range of the mounting head above the feeder setting section is limited to a narrow range of up to the vicinity of a component pickup position of the feeder in order to prevent the interference, the region in which the nozzles can be arranged on the nozzle station is also limited to a narrow range of up to the vicinity of the component pickup position of the feeder, so the number of nozzles which can be arranged on a single nozzle station decreases, thus the exchange frequency of the nozzle station increases, leading to a demerit in that the operating ratio of the component mounter is reduced.

Therefore, an object of the present disclosure is to provide a cassette-type nozzle exchanging unit and a replacement system thereof that simplifies the work of exchanging the nozzle station, and increases the number of nozzles which can be arranged on a single nozzle station to reduce the exchange frequency of the nozzle station, thus increasing the operating rate of the component mounter.

Solution to Problem

In order to solve the problem described above, the present disclosure provides a cassette-type nozzle exchanging unit, comprising: a revolving nozzle station for exchanging a nozzle that picks up a component supplied by a feeder which is set on a feeder setting section of a component mounter in a detachable manner, the revolving nozzle station holding multiple nozzles arranged along a revolution path; a revolving drive device that causes the revolving nozzle station to revolve with the center thereof facing horizontally; and a cassette case that houses the revolving nozzle station and the revolving drive device, wherein a nozzle exchange port is formed in a top surface of the cassette case, and nozzle exchange is performed between the revolving nozzle station and a mounting head of the component mounter through the nozzle exchange port, and wherein the cassette-type nozzle exchanging unit is configured to be capable of being set on the feeder setting section of the component mounter next to the feeder.

Since the present disclosure is configured such that multiple nozzles are arranged along the revolution path of the revolving nozzle station, in comparison to conventional nozzle stations in which multiple nozzles are arranged in a planar manner, a greater number of the nozzles can be arranged on a single revolving nozzle station, thus it is possible to reduce the exchange frequency of the cassette-type nozzle exchanging unit. Also, since nozzle exchange is performed between the revolving nozzle station and the mounting head of the component mounter through the nozzle exchange port which is formed on the top surface of the cassette case, by setting the position of the nozzle exchange port to a position at which the mounting head does not interfere with an adjacent feeder (for example, the same position as the component pickup position of the feeder), it is possible to avoid the mounting head interfering with adjacent feeders during nozzle exchange. Further, since the cassette-type nozzle exchanging unit is set on the feeder setting section of the component mounter, it is possible to exchange the cassette-type nozzle exchanging unit using simple work similar to exchange work of a feeder. Thus, it is not necessary to secure space specifically for the cassette-type nozzle exchanging unit within the component mounter, leading to space saving.

A shutter mechanism that opens and closes the nozzle exchange port may be provided in the cassette-type nozzle exchanging unit of the present disclosure. In this case, by closing the nozzle exchange port of the cassette case using the shutter mechanism when nozzle exchange is not being performed, it is possible to protect the nozzles in the cassette case from obstructions from the outside during transporting or the like, and it is possible to prevent the adherence of foreign matter such as debris to the nozzles in the cassette case.

A nozzle identification information recording section in which identification information of the respective nozzle is recorded or stored may be provided on the multiple nozzles which are held in the revolving nozzle station, an identification information reading device that reads the identification information from the nozzle identification information recording section of the nozzles may be provided in the cassette case in a predetermined position on a path through which the nozzles which are held in the revolving nozzle station revolve, and the cassette-type nozzle exchanging unit may be configured to confirm the identification information of the nozzle which is positioned in the nozzle exchange port based on the identification information which is read by the identification information reading device and a revolution position of the revolving nozzle station. In this case, it is possible to confirm whether the nozzle which is to be exchanged through the nozzle exchange port during nozzle exchange is the nozzle specified in the production job.

Alternatively, an identification information reading device that reads the identification information from the nozzle identification information recording section of the nozzle which is positioned in the nozzle exchange port may be provided in the mounting head. When a camera which images a reference position mark or the like of a board is installed in the mounting head, it is possible to use the camera as the identification information reading device.

The exchange work of the cassette-type nozzle exchanging unit of the present disclosure may be performed manually by a worker, or may be automated.

A replacement system that automates the exchange work may include a stock section which stores a replacement cassette-type feeder with which to replace a used cassette-type feeder which is set in the feeder setting section; and a replacement robot which removes the used cassette-type feeder from the feeder setting section and stores the used cassette-type feeder in the stock section, and removes the replacement cassette-type feeder from the stock section and sets the replacement cassette-type feeder in the feeder setting section. In the replacement system, a replacement cassette-type nozzle exchanging unit, which replaces a used cassette-type nozzle exchanging unit which is set in the feeder setting section, may be stored in the stock section next to the replacement cassette-type feeder, and the replacement robot may remove the used cassette-type nozzle exchanging unit from the feeder setting section and store the used cassette-type nozzle exchanging unit in the stock section, and remove the replacement cassette-type nozzle exchanging unit from the stock section and set the replacement cassette-type nozzle exchanging unit in the feeder setting section. In this case, it is possible to freely replace the cassette-type nozzle exchanging unit and the cassette-type feeder between the feeder setting section and the stock section using the replacement robot during operation of the component mounter, thus improving the operating ratio of the component mounter.

The replacement robot may remove the cassette-type nozzle exchanging unit from the feeder setting section and store the cassette-type nozzle exchanging unit in the stock section during a period in which it is not necessary to perform nozzle exchange. In this case, during a period in which it is not necessary to perform the nozzle exchange, it is possible to use all of the space of the feeder setting section as space for setting the cassette-type feeders, and it is not necessary to reduce the number of the cassette-type feeders which are set in the feeder setting section.

The cassette-type nozzle exchanging unit and the cassette-type feeder may have the same external height dimensions and depth dimensions. In this case, it is possible to treat the cassette-type nozzle exchanging unit in the same manner as the cassette-type feeder with the replacement robot, and it becomes easy to place a mixture of both in the feeder setting section. In this case, the width dimensions of both may be the same, or may be different.

DESCRIPTION OF EMBODIMENTS

Figure 1:
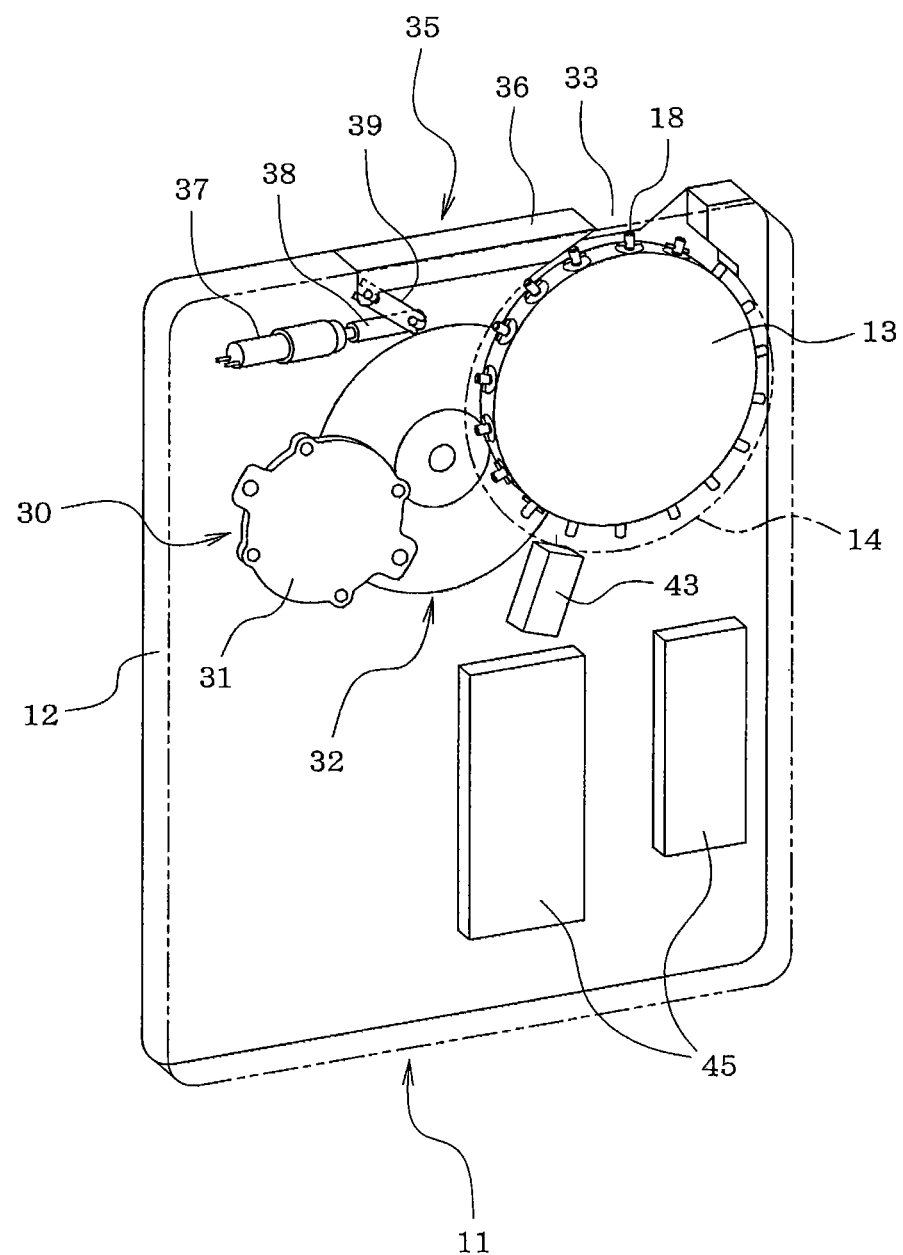
FIG. 1 is a perspective view illustrating a cassette-type nozzle exchanging unit of a first embodiment of the present disclosure.
Figure 2:
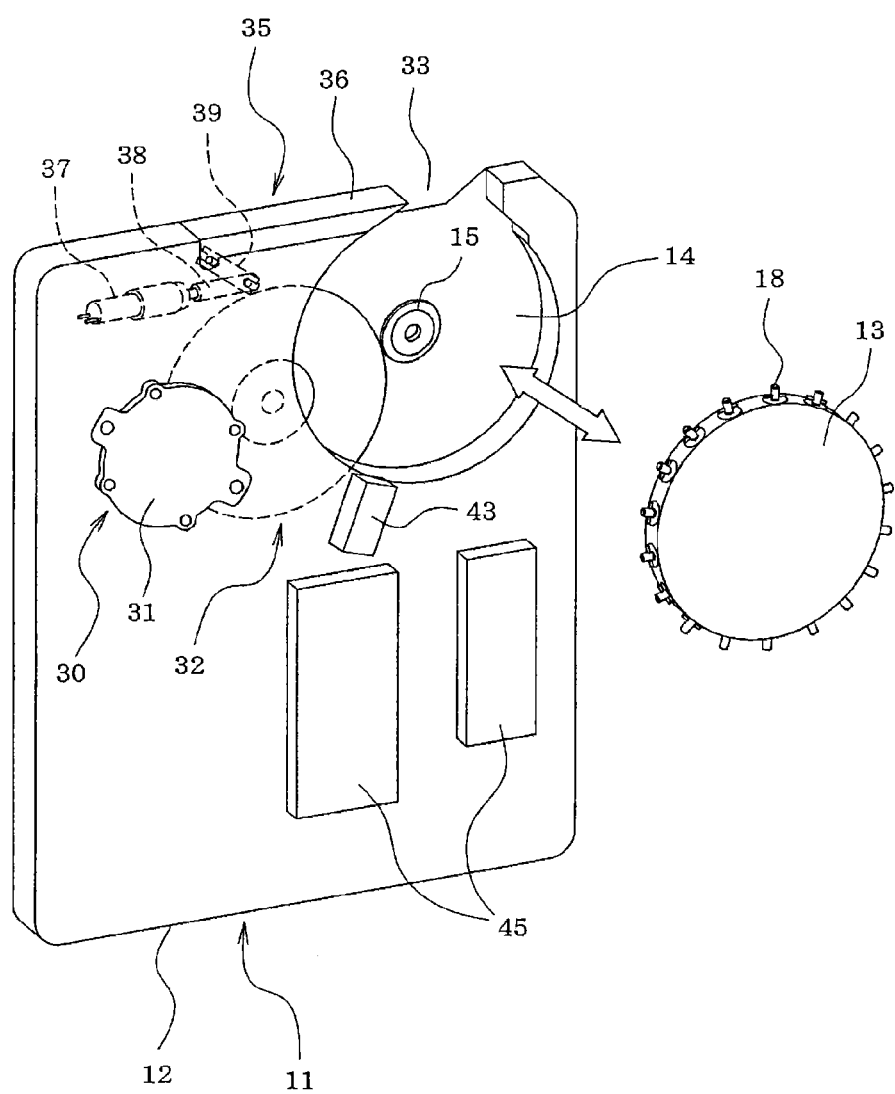
FIG. 2 is a perspective view illustrating a state in which a revolving nozzle station is removed from the cassette-type nozzle exchanging unit of the first embodiment.

Hereinafter, description will be given of five, the first to the fifth, embodiments of the present disclosure.

First Embodiment

Description will be given of the first embodiment of the present disclosure based on FIG. 1 to FIG. 8. First, description will be given of the configuration of cassette-type nozzle exchanging unit 11 based on FIG. 1 and FIG. 2.

Cassette case 12 of cassette-type nozzle exchanging unit 11 is formed of a transparent or opaque plastic plate, a metal plate, or the like, and the side surface section (cover) is capable of opening and closing. A circular recessed nozzle station loading section 14 in which disc-shaped revolving nozzle station 13 is detachably (exchangeably) loaded is provided inside cassette case 12, drive shaft 15 (refer to FIG. 2) is provided facing horizontally in the center of nozzle station loading section 14, and the center section of revolving nozzle station 13 is detachably connected to drive shaft 15 such that transfer of rotation is possible.

Figure 3:
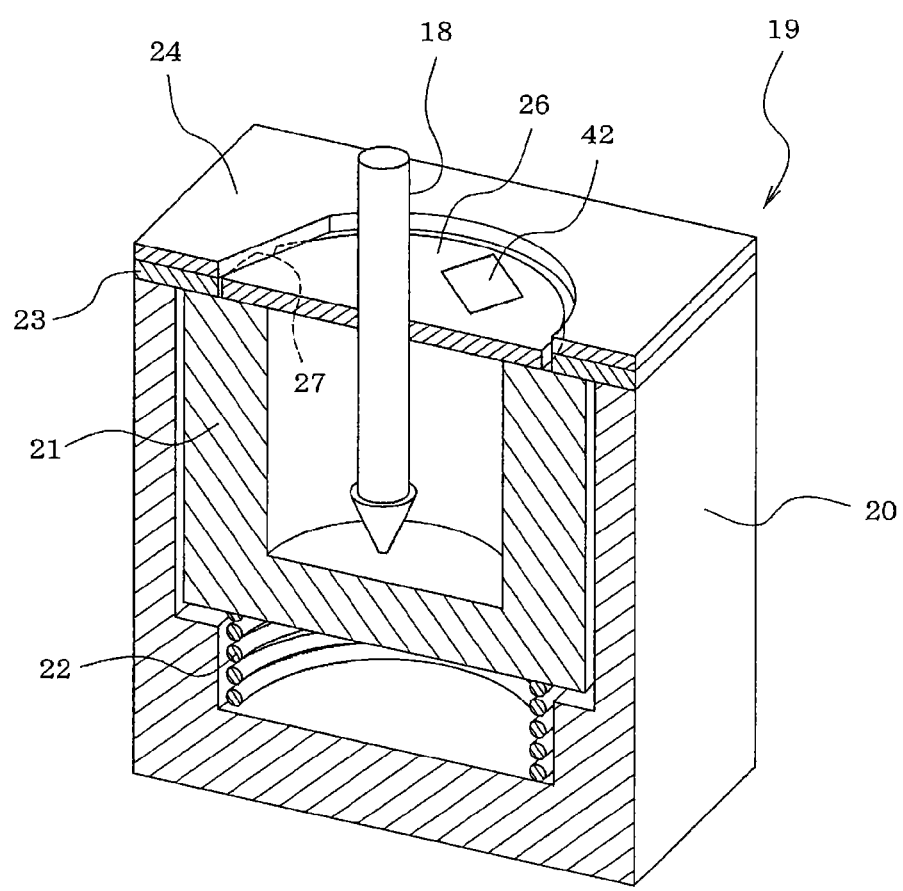
FIG. 3 is a perspective view illustrating a section of a nozzle holder of the revolving nozzle station of the first embodiment.
Figure 4:
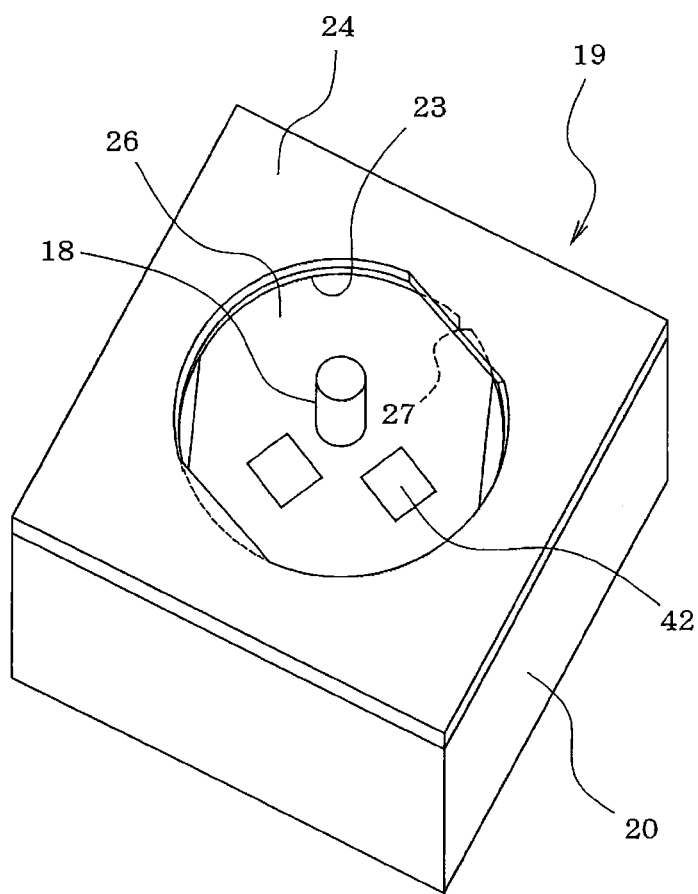
FIG. 4 is a perspective view illustrating a state in which the nozzle holder of the revolving nozzle station of the first embodiment is holding a nozzle.
Figure 5:
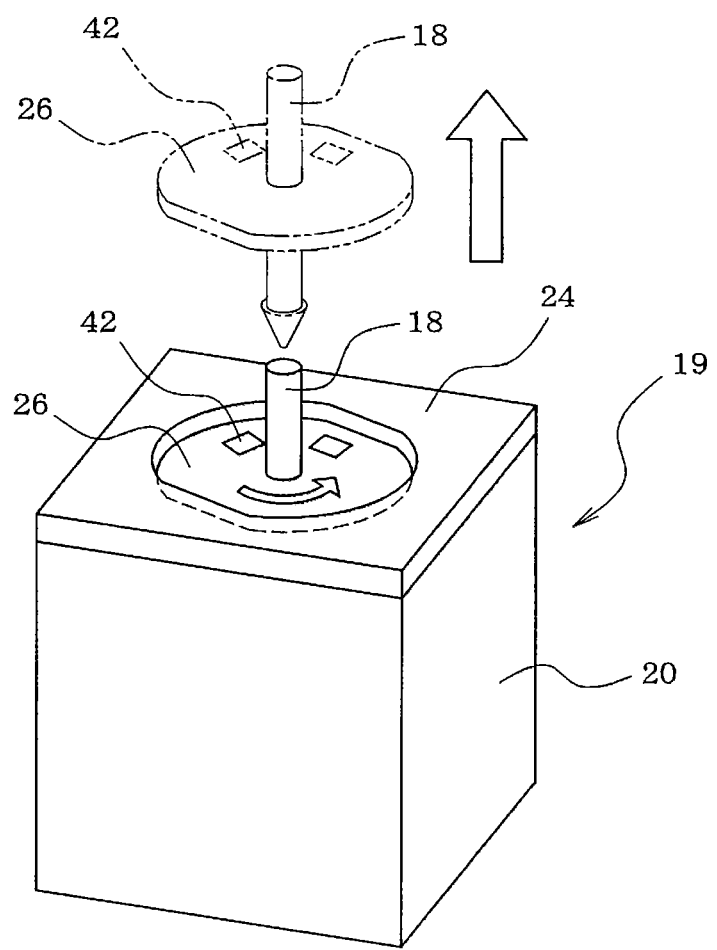
FIG. 5 is a perspective view illustrating an operation of removing the nozzle from the nozzle holder of the revolving nozzle station of the first embodiment.

On the outer circumferential section of disc-shaped revolving nozzle station 13, multiple nozzles 18 for exchanging with a nozzle of amounting head 58 (refer to FIG. 8) of component mounter 55 which is described later are arranged radially along the revolution path, and revolving nozzle station 13 is configured to hold the multiple nozzles 18 in a detachable manner. Here, description will be given of the holding mechanism of nozzle 18 using FIG. 3 to FIG. 5. Each of FIG. 3 to FIG. 5 depicts nozzle holder 19 which holds one of the nozzles 18. Therefore, in the outer circumferential section of revolving nozzle station 13, a number of nozzle holders 19 equal to the number of nozzles 18 to be held is provided radially at a predetermined nozzle arrangement pitch.

Holder case 20 of nozzle holder 19 is fixed radially to the outer circumferential section of revolving nozzle station 13, nozzle retainer 21 in holder case 20 is stored to be capable of moving in the radial direction (the up-down direction in FIG. 3) of revolving nozzle station 13, and nozzle retainer 21 is biased in the outward radial direction (the up direction in FIG. 3) of revolving nozzle station 13 by spring 22 which is stored in the bottom section of holder case 20. In the opening (the top surface portion in FIG. 3) of holder case 20, positioning plate 23 and clamp plate 24 are fixed to overlap each other, with clamp plate 24 positioned on the outside, and positioning plate 23 positioned on the inside. Flange-shaped flange 26 of nozzle 18 is formed in a shape with directionality (for example, an oblong, an oval shape, or the like), and an opening through which flange 26 of nozzle 18 can be removed and inserted and which has a similar shape to the shape of flange 26 is formed in clamp plate 24 which is on the outside. An opening which overlaps the entire opening of clamp plate 24 which is on the outside is formed in positioning plate 23 which is on the inside, and it is possible to rotationally move flange 26 of nozzle 18 by only a predetermined angle within the opening of positioning plate 23 because a positioning section 27 (refer to FIG. 4) which determines the limit position of the rotational movement range as a fixed angle is provided on the opening.

When nozzle holder 19 is caused to hold nozzle 18, flange 26 of nozzle 18 is inserted into the opening of clamp plate 24 in a state in which flange 26 of nozzle 18 is aligned with the opening of clamp plate 24, and nozzle retainer 21 is pushed in against the spring force of spring 22. Accordingly, when flange 26 of nozzle 18 is pushed in to a height which it fits inside the opening of positioning plate 23, flange 26 of nozzle 18 becomes rotatable inside the opening of positioning plate 23. In this state, flange 26 of nozzle 18 is rotated and positioned by positioning section 27. Accordingly, flange 26 of nozzle 18 is sandwiched between clamp plate 24 and nozzle retainer 21, and nozzle 18 becomes clamped. When removing nozzle 18 from nozzle holder 19, the opposite operation to the above description is performed.

Meanwhile, as illustrated in FIG. 1, revolving drive device 30 that revolves (rotates) revolving nozzle station 13 is provided inside cassette case 12. Revolving drive device 30 is formed from motor 31 which serves as a drive source, and gear mechanism 32 which transmits the rotation of motor 31 to drive shaft 15.

Nozzle exchange port 33 is formed in a position corresponding to the topmost end (in a direction straight up from the center of revolving nozzle station 13) of revolving nozzle station 13 within the top surface of cassette case 12, and nozzle exchange is performed between revolving nozzle station 13 and mounting head 58 (refer to FIG. 8) of component mounter 55 through nozzle exchange port 33.

Figure 6:
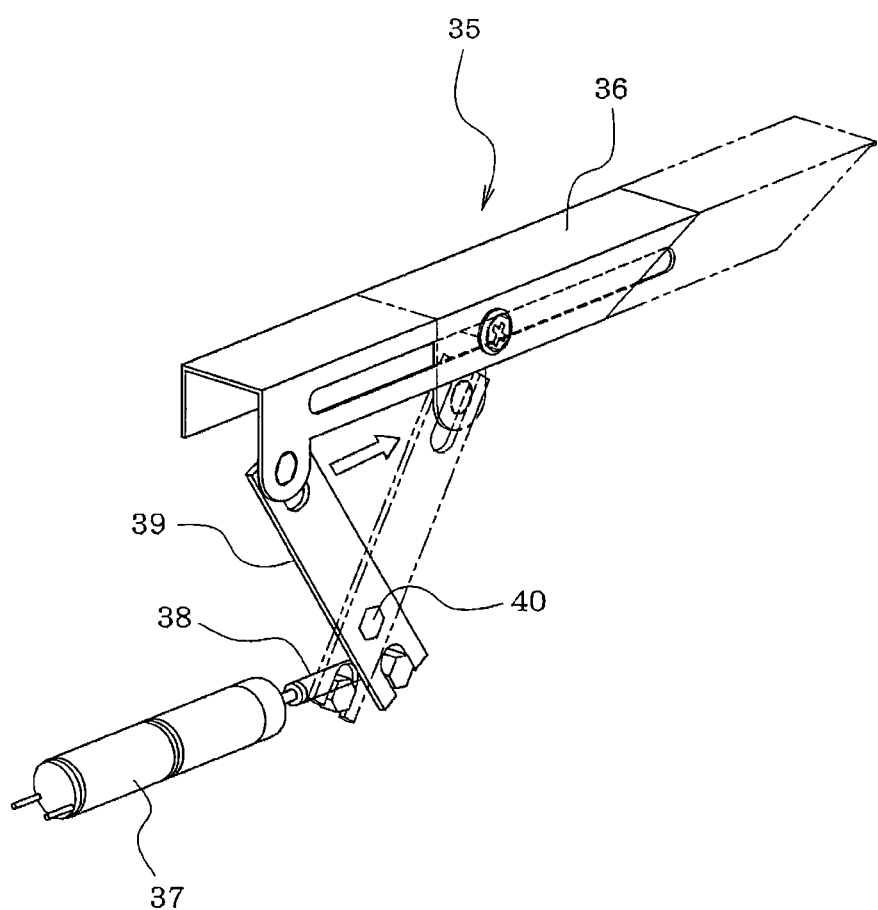
FIG. 6 is a perspective view illustrating a shutter mechanism of the cassette-type nozzle exchanging unit of the first embodiment.

Shutter mechanism 35 that opens and closes nozzle exchange port 33 is provided in cassette case 12. As illustrated in FIG. 6, shutter mechanism 35 is formed from shutter plate 36 that moves by sliding along nozzle exchange port 33, motor 37 that serves as the drive source, feed gear 38 that converts the rotation of motor 37 to linear motion, and link member 39 that connects feed gear 38 and shutter plate 36. The position of support shaft 40 that supports link member 39 is in a manner to be swingable nearer the feed gear 38 side than the center of link member 39. The linear motion of feed gear 38 is amplified and transmitted to shutter plate 36, such that the opening and closing operation time of shutter plate 36 is shortened.

Note that, the drive source of shutter mechanism 35 is not limited to motor 37, and shutter plate 36 may be driven to open and close using another actuator (for example, a cylinder, a solenoid, or the like).

As illustrated in FIG. 3 to FIG. 5, nozzle identification information recording section 42 that records or stores identification information (hereinafter given as a "nozzle ID") of nozzle 26 is provided on the top surface of flange 26 of nozzle 18. For nozzle identification information recording section 42, a code label in which the nozzle ID is recorded as a bar-code, a two-dimensional code, or the like may be used, or an electronic tag (also referred to as an RF tag, an IC tag, an electromagnetic wave tag, a wireless tag, or the like) which stores the data of the nozzle ID may be used.

In regard to this, reader 43 (identification information reading device) that reads the nozzle ID from nozzle identification information recording section 42 of flange 26 of any one of the nozzles 18 which are held in revolving nozzle station 13 is provided inside cassette case 12 so as to face nozzle 18. The nozzle ID which is read by reader 43 is stored in the memory of control device 45, the nozzle ID of the nozzle 18 which is positioned in nozzle exchange port 33 is determined based on the stored data of the nozzle ID and the revolution angle (the rotation angle) of revolving nozzle station 13, and it is confirmed whether the nozzle 18 which is to be exchanged through nozzle exchange port 33 during nozzle exchange is the nozzle as specified in the production job.

In this case, once cassette-type nozzle exchanging unit 11 is installed on feeder setting section 61 of component mounter 55 which will be described later, the revolving nozzle station 13 may be revolved (rotated) straight away, and the reading of the nozzle IDs of all of the nozzles 18 may be completed using reader 43. A link may be created between each of the nozzle IDs and the revolution position (the rotation position) of each of the nozzles 18, and this information may be stored in the memory of control device 45.

Meanwhile, a unit identification information recording section (not shown) which records or stores identification information (hereinafter given as a "nozzle exchanging unit ID") of cassette-type nozzle exchanging unit 11 is provided at a predetermined position in cassette case 12. For the unit identification information recording section, a code label in which the nozzle exchanging unit ID is recorded as a bar-code, a two-dimensional code, or the like may be used, or an electronic tag which stores the data of the nozzle exchanging unit ID may be used.

In addition, while not shown in the drawings, a connector for communication and power which is connected to a connector for communication and power of component mounter 55 is provided on cassette case 12, and control signals and the like are transmitted and received between control device 45 inside cassette case 12 and the control device of component mounter 55, and power is supplied to control device 45 and the like inside cassette case 12 by both connectors being connected to each other. Control device 45 controls motor 31 that drives revolving nozzle station 13 and motor 37 that drives shutter mechanism 35, and controls the reading operation of the nozzle ID of reader 43, stores the read nozzle ID in the memory of control device 45, and confirms the nozzle ID of the nozzle 18 which is positioned in nozzle exchange port 33.

Figure 7:
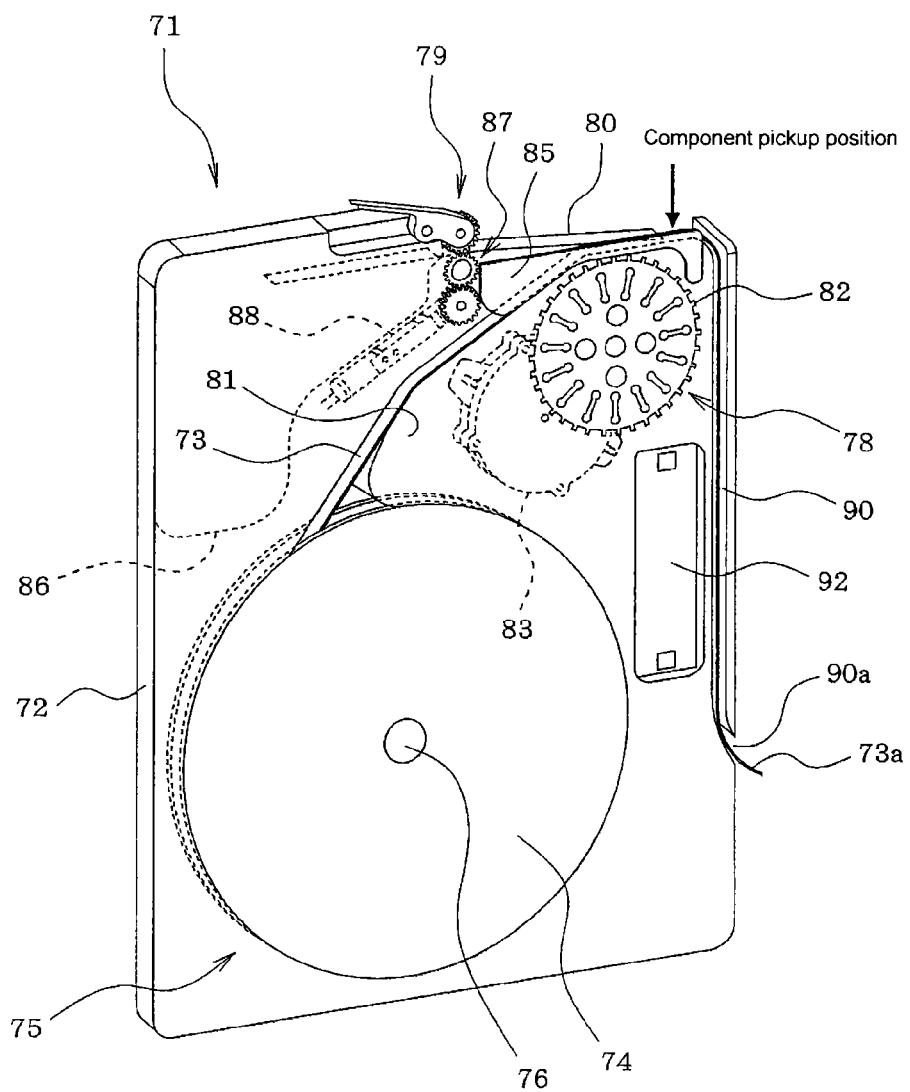
FIG. 7 is a perspective view illustrating a cassette-type feeder of the first embodiment.
Figure 8:
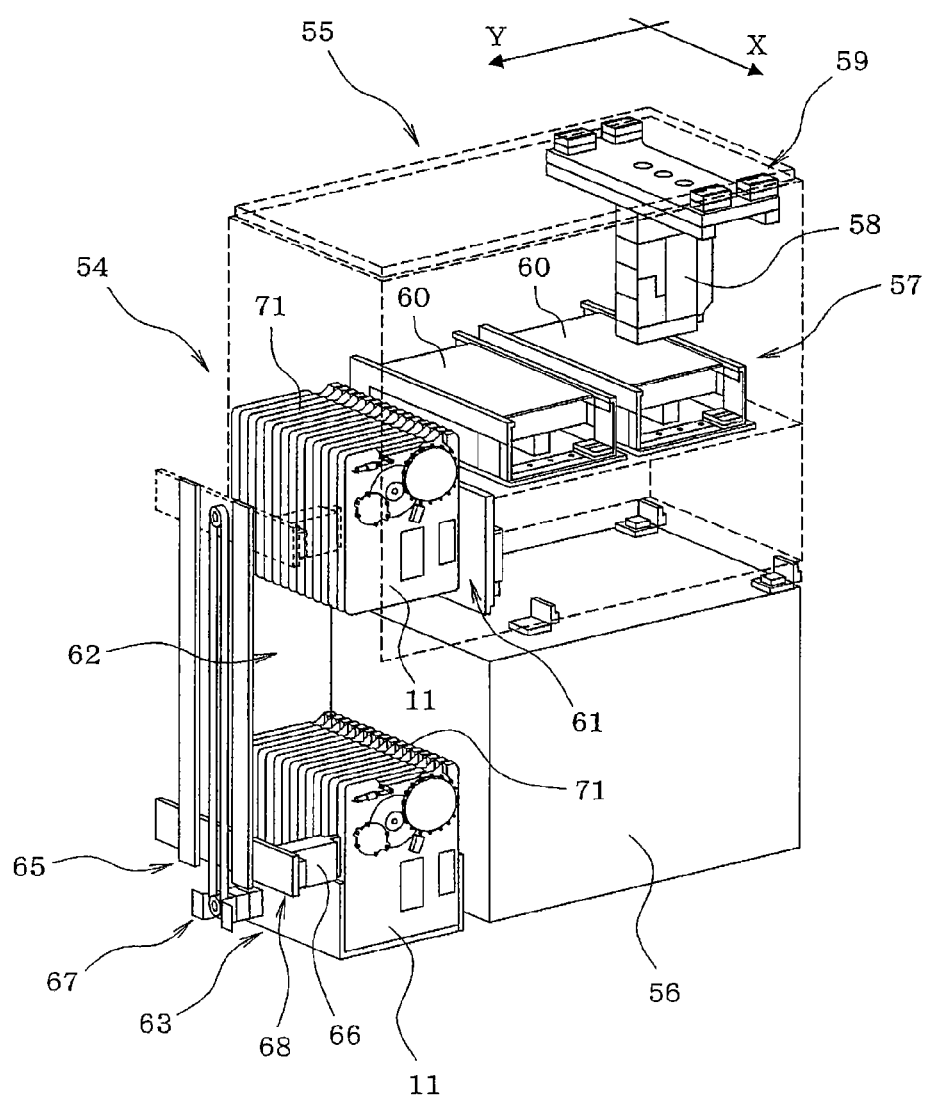
FIG. 8 is a perspective view illustrating a replacement system which automatically exchanges the cassette-type nozzle exchanging unit and the cassette-type feeder of the first embodiment.

As illustrated in FIG. 8, the cassette-type nozzle exchanging unit 11 configured as described above is set in feeder setting section 61 of component mounter 55 next to a cassette-type feeder 71 (refer to FIG. 7). Cassette-type nozzle exchanging unit 11 and cassette-type feeder 71 are configured such that the external height dimensions and depth dimensions are the same, and the position of nozzle exchange port 33 of cassette-type nozzle exchanging unit 11 and the component pickup position of cassette-type feeder 71 are set to have the same Y direction position (the Y direction is the direction which orthogonally intersects the transport direction of conveyor 57). In this case, the width dimension of cassette-type nozzle exchanging unit 11 and width dimension of the cassette-type feeder 71 may be the same, or may be different. Multiple cassette-type feeders 71 with different width dimensions may be set in feeder setting section 61 of component mounter 55.

Next, description will be given of the configuration of cassette-type feeder 71 using FIG. 7. Cassette case 72 of cassette-type feeder 71 is formed of a transparent or opaque plastic plate, a metal plate, or the like, and the side surface (cover) is capable of opening and closing. Tape loading section 75, in which tape reel 74 around which component supply tape 73 is wound is loaded in a detachable (exchangeable) manner, is provided inside the cassette case 72. Reel holding shaft 76 which holds tape reel 74 in a rotatable manner is provided in the center of tape loading section 75.

Tape feed mechanism 78 that feeds the component supply tape 73 which is pulled out from tape reel 74 to the component pickup position, and a top film peeling mechanism 79 that peels top film 80 from component supply tape 73 before the component pickup position to expose components in component supply tape 73 are provided inside cassette case 72. The component pickup position is in the vicinity of the end portion of the tape feeding direction side of the top surface of cassette case 72. Tape guide 81 that guides component supply tape 73 which is pulled out from tape reel 74 to the component pickup position is provided inside cassette case 72.

Tape feed mechanism 78 is formed from sprocket 82 which is provided in the vicinity below the component pickup position, and motor 83 that drives sprocket 82 to rotate, and tape feed mechanism 78 pitch feeds component supply tape 73 to the component pickup position by engaging the teeth of sprocket 82 with tape feeding holes which are formed in the edge of one side of component supply tape 73 at a predetermined pitch and rotating sprocket 82.

Top film peeling mechanism 79 is formed from tape retainer 85 for retaining the component supply tape 73 before the component pickup position and peeling top film 80 from the top surface of component supply tape 73, top film feed gear mechanism 87 which pulls the top film 80 which is peeled by tape retainer 85 in the opposite direction from the tape feeding direction to feed top film 80 into top film collection section 86 which is provided on the top portion of cassette case 72, motor 88 that drives top film feed gear mechanism 87, and the like.

Waste tape disposal path 90 that guides waste tape 73a (in the first embodiment, only the carrier tape from which top film 80 has been peeled), which has passed the component pickup position and from which the components have been removed, downward to dispose of waste tape 73a is provided extending downwards at the end section of the tape feeding direction side within cassette case 72, and outlet 90a of waste tape disposal path 90 is provided in a position closer to the bottom side than the center of the end surface of the tape feeding direction side of cassette case 72. An air inlet (not shown) is provided in the top portion of waste tape disposal path 90 so as to be open in the end surface of the tape feeding direction side within the cassette case 72, and is configured to allow air to enter waste tape disposal path 90 from the air inlet and to cause a downward flow of the air within waste tape disposal path 90.

Control device 92 that controls motor 83 of tape feed mechanism 78 and motor 88 of top film peeling mechanism 79 is provided within cassette case 72. In addition, while not shown in the drawings, a connector for communication and power which is connected to the connector for communication and power of component mounter 55 is provided in cassette case 72.

An identification information recording section (not shown) which records or stores feeder identification information (hereinafter given as a "feeder ID") is provided at a predetermined position in cassette case 72. For the identification information recording section, a code label in which the feeder ID is recorded as a bar-code, a two-dimensional code, or the like may be used, or an electronic tag (also referred to as an RF tag, an IC tag, an electromagnetic wave tag, a wireless tag, or the like) which stores the data of the feeder ID may be used.

Note that, cassette-type feeder 71 is not limited to the configuration of FIG. 7, for example, a winding unit which winds the component supply tape may be provided within the cassette case, and the component supply tape which is guided into the cassette case from the outside may be loaded into the cassette case by winding the component supply tape onto the winding unit.

Next, using FIG. 8, description will be given of replacement system 54 which automatically exchanges cassette-type nozzle exchanging unit 11 and cassette-type feeder 71.

Component mounter 55 is installed on base table 56. Component mounter 55 is provided with two conveyors 57 that transport circuit board 60, mounting head 58 that holds a nozzle (not shown) which picks up a component supplied from cassette-type feeder 71 and mounts the component on the circuit board 60, an XY movement mechanism 59 that moves mounting head 58 in the X and Y directions (left, right, forward, and backward directions), an imaging device (not shown) that images the component picked up by the nozzle, and the like.

Replacement system 54 is detachably arranged on the front (the direction orthogonally intersecting the transport direction of the conveyors 57) of component mounter 55. Feeder setting section 61, replacement area 62, and stock section 63 are provided vertically in three levels in replacement system 54. Feeder setting section 61 which is positioned on the topmost level is an area in which multiple cassette-type feeders 71 which supply components to the component pickup position of component mounter 55 and cassette-type nozzle exchanging units 11 are set next to each other. Feeder setting section 61 is provided with a positioning mechanism (not shown) of a positioning pin or the like which positions the cassette-type feeders 71 and the cassette-type nozzle exchanging units 11, and a holding mechanism (not shown) which holds the cassette-type feeders 71 and the cassette-type nozzle exchanging units 11 using a spring mechanism or the like. Furthermore, a connector (not shown) for communication and power which is connected to a connector (not shown) for communication and power of cassette-type feeder 71 or to a connector (not shown) for communication and power of cassette-type nozzle exchanging unit 11 is provided in the feeder setting section 61, control signals and the like are transmitted and received between control device 92 of cassette-type feeder 71 or control device 45 of cassette-type nozzle exchanging unit 11 and the control device of the component mounter 55, and each of the control devices 92, 45, and the like is electrified by both connectors being connected to each other.

Stock section 63, which is positioned on the bottommost level, stores the replacement cassette-type feeder 71 and the replacement cassette-type nozzle exchanging unit 11 of the feeder setting section 61 that replace the used cassette-type feeder 71 and the used cassette-type nozzle exchanging unit 11, and is an area that stores the used cassette-type feeder 71 and the used cassette-type nozzle exchanging unit 11. In stock section 63, a number of slots, in each of which cassette-type feeder 71 or cassette-type nozzle exchanging unit 11 is set, equal to the number of feeders which can be stored in the stock section 63 are formed, an identification information reading section (not shown) that reads the feeder ID or the nozzle exchanging unit ID from the identification information recording section of cassette-type feeder 71 or the identification information recording section of cassette-type nozzle exchanging unit 11 which is set in each of the slots is provided, the feeder ID or the nozzle exchanging unit ID which is read by the identification information reading section is transmitted to the control device of replacement system 54, and the classification of the cassette-type feeder 71 or the cassette-type nozzle exchanging unit 11 which is set in each of the slots is identified automatically.

Note that, cassette-type feeder 71 and cassette-type nozzle exchanging unit 11 which are used to mount a component on the printed circuit board which will be produced next may be set in stock section 63.

Replacement area 62, which is positioned in the middle level, is an area for moving cassette-type feeder 71 or cassette-type nozzle exchanging unit 11 in the left-right direction (the X direction) in alignment with a vacant slot (a vacant space) of feeder setting section 61 and stock section 63 when replacing cassette-type feeder 71 or cassette-type nozzle exchanging unit 11 between feeder setting section 61 and stock section 63.

Replacement robot 65 is provided at the front of replacement system 54. Replacement robot 65 is formed from clamp mechanism 66 that clamps cassette-type feeder 71 or cassette-type nozzle exchanging unit 11, lifting and lowering mechanism 67 that lifts and lowers clamp mechanism 66 between feeder setting section 61 and stock section 63, and a horizontal movement mechanism 68 that moves clamp mechanism 66 in the arrangement direction of cassette-type feeders 71 in replacement area 62. In FIG. 8, only one replacement robot 65 is shown; however, a configuration may be adopted in which two replacement robots 65 are provided. Below, description will be given of an example in which two of the replacement robots 65 are used.

Next, description will be given of operations of replacement system 54 of the configuration described above. During production (during operation of component mounter 55), a number of the cassette-type feeders 71 and the cassette-type nozzle exchanging units 11 which is necessary for production are set in feeder setting section 61 of the topmost level of replacement system 54, and replacement cassette-type feeder 71 which is to replace a used (out of components) cassette-type feeder 71 and replacement cassette-type nozzle exchanging unit 11 which is to replace a used cassette-type nozzle exchanging unit 11 of feeder setting section 61 are stored in the stock section 63 of the bottommost level.

When one of the cassette-type feeders 71 or the cassette-type nozzle exchanging units 11 of feeder setting section 61 becomes used during production, clamp mechanism 66 of one of the replacement robots 65 is lifted to the position of feeder setting section 61 by the lifting and lowering mechanism 67, then clamp mechanism 66 is moved in the X direction (the arrangement direction of cassette-type feeders 71) by horizontal movement mechanism 68, the position of clamp mechanism 66 is aligned with the position of the used cassette-type feeder 71 or the used cassette-type nozzle exchanging unit 11, and the used cassette-type feeder 71 or the used cassette-type nozzle exchanging unit 11 is clamped and removed from the holding mechanism of feeder setting section 61. Subsequently, after lowering the used cassette-type feeder 71 or the used cassette-type nozzle exchanging unit 11 which is clamped in clamp mechanism 66 to the replacement area 62 of the middle level by lowering clamp mechanism 66 to replacement area 62 of the middle level, clamp mechanism 66 is moved in the X direction by horizontal movement mechanism 68, the position in the X direction of the used cassette-type feeder 71 or the used cassette-type nozzle exchanging unit 11 is aligned with the position of a vacant slot of stock section 63 of the bottommost level, then the used cassette-type feeder 71 or the used cassette-type nozzle exchanging unit 11 is lowered and stored in the vacant slot of stock section 63. Note that, when there is no vacant slot in the stock section 63, the used cassette-type feeder 71 or the used cassette-type nozzle exchanging unit 11 stands by in the replacement area 62. The standby is canceled by the used cassette-type feeder 71 or the used cassette-type nozzle exchanging unit 11 in stock section 63 being manually or automatically removed.

At the same time, or almost the same time, as operation in which the used cassette-type feeder 71 or the used cassette-type nozzle exchanging unit 11 is removed from feeder setting section 61 of the topmost level in this manner and stored in stock section 63 of the bottommost level, clamp mechanism 66 of the other replacement robot 65 is lowered to the position of stock section 63 of the bottommost level by lifting and lowering mechanism 67, then clamp mechanism 66 is moved in the X direction by horizontal movement mechanism 68, clamp mechanism 66 is aligned with the position of the replacement cassette-type feeder 71 or the replacement cassette-type nozzle exchanging unit 11 which is to replace the used cassette-type feeder 71 or the used cassette-type nozzle exchanging unit 11, and the replacement cassette-type feeder 71 or the replacement cassette-type nozzle exchanging unit 11 is clamped. Subsequently, after lifting the replacement cassette-type feeder 71 or the replacement cassette-type nozzle exchanging unit 11 which is clamped in clamp mechanism 66 to replacement area 62 of the middle level by lifting clamp mechanism 66 to replacement area 62 of the middle level, clamp mechanism 66 is moved in the X direction by horizontal movement mechanism 68, the position in the X direction of the replacement cassette-type feeder 71 or the replacement cassette-type nozzle exchanging unit 11 is aligned with the position of the slot from which the used cassette-type feeder 71 or the used cassette-type nozzle exchanging unit 11 of feeder setting section 61 of the topmost level was removed, then the replacement cassette-type feeder 71 or the replacement cassette-type nozzle exchanging unit 11 is lifted and set in the slot of feeder setting section 61. During setting, the replacement cassette-type feeder 71 or the replacement cassette-type nozzle exchanging unit 11 is positioned by the positioning mechanism, and held by the holding mechanism.

Note that, the work of setting cassette-type feeder 71 or cassette-type nozzle exchanging unit 11 in feeder setting section 61 before starting production may be performed manually by a worker, or cassette-type feeder 71 or cassette-type nozzle exchanging unit 11 may be switched from stock section 63 to feeder setting section 61 by replacement robot 65.

A configuration may be adopted in which it is possible to look up the classification of nozzle 18 within cassette-type nozzle exchanging unit 11 by only performing the work of reading the nozzle exchanging unit ID from the identification information recording section of the cassette-type nozzle exchanging unit 11 in advance outside of the component mounter 55 (replacement system 54), transmitting the data of the nozzle exchanging unit ID to a production management computer (not shown) of a component mounting line containing component mounter 55, converting a combination of the nozzle exchanging unit ID and nozzle IDs (a combination of the cassette-type nozzle exchanging unit 11 and the nozzles 18 held therein) into a database and storing the database using the production management computer, and reading the nozzle exchanging unit ID from the identification information recording section of cassette-type nozzle exchanging unit 11 using component mounter 55 (replacement system 54).

Meanwhile, when mounting head 58 of component mounter 55 is caused to hold a nozzle 18 inside the cassette-type nozzle exchanging unit 11 which is set in feeder setting section 61 of component mounter 55, mounting head 58 is moved above nozzle exchange port 33 of cassette-type nozzle exchanging unit 11, and shutter plate 36 of shutter mechanism 35 is subjected to an opening operation to open nozzle exchange port 33. After the revolving nozzle station 13 within cassette-type nozzle exchanging unit 11 is rotated as appropriate such that the nozzle 18 to be exchanged this time is positioned in nozzle exchange port 33, mounting head 58 is lowered, the nozzle 18 is held in mounting head 58 through nozzle exchange port 33, then mounting head 58 is lifted and the nozzle 18 is removed from nozzle holder 19.

Note that, a configuration may be adopted in which, when returning the nozzle 18 which is held in the mounting head 58 to the vacant nozzle holder 19 of the revolving nozzle station 13 within the cassette-type nozzle exchanging unit 11, after rotating the revolving nozzle station 13 within the cassette-type nozzle exchanging unit 11 as appropriate and positioning the vacant nozzle holder 19 at the nozzle exchange port 33, the mounting head 58 is lowered and the nozzle 18 of the mounting head 58 is gripped by the nozzle holder 19 through the nozzle exchange port 33.

A configuration may be adopted in which cassette-type nozzle exchanging unit 11 is removed from feeder setting section 61 using replacement robot 65 and stored in stock section 63 during a period in which it is not necessary to perform nozzle exchange. In this case, there is a merit in that, during a period in which it is not necessary to perform nozzle exchange, it is possible to use all of the space of feeder setting section 61 as space for setting cassette-type feeders 71, and it is not necessary to reduce the number of cassette-type feeders 71 which are set in feeder setting section 61.

Since cassette-type nozzle exchanging unit 11 of the first embodiment described above is configured such that the multiple nozzles 18 are arranged radially on revolving nozzle station 13, in comparison to conventional nozzle stations in which multiple nozzles are arranged in a planar manner, it is possible to increase the number of nozzles 18 which can be arranged on one of the revolving nozzle stations 13. Thus, it is possible to reduce the exchange frequency of cassette-type nozzle exchanging units 11. In addition, since nozzle exchange is performed between revolving nozzle station 13 and mounting head 58 of component mounter 55 through nozzle exchange port 33 which is formed on the top end surface of cassette case 12, by setting the position of nozzle exchange port 33 to a position at which mounting head 58 does not interfere with an adjacent cassette-type feeder 71 (for example, the same position as the component pickup position of cassette-type feeder 71), it is possible to avoid mounting head 58 interfering with an adjacent cassette-type feeder 71 during the nozzle exchange. Furthermore, since the configuration is such that cassette-type nozzle exchanging unit 11 is set in feeder setting section 61 of component mounter 55, it is possible to exchange cassette-type nozzle exchanging unit 11 using similarly simple work to the exchange work of a cassette-type feeder 71. Thus, it is not necessary to secure space specifically for cassette-type nozzle exchanging unit 11 within component mounter 55, leading to space saving.

In addition, in the first embodiment, since cassette-type nozzle exchanging unit 11 is provided with shutter mechanism 35 which opens and closes nozzle exchange port 33 of cassette case 12, by closing nozzle exchange port 33 of cassette case 12 using shutter mechanism 35 during a period in which nozzle exchange is not performed, it is possible to protect the nozzles 18 within cassette case 12 from obstructions from the outside during transporting or the like, and it is possible to prevent the adherence of foreign matter such as debris to the nozzles 18 within cassette case 12.

Furthermore, in the first embodiment, since the configuration is such that replacement robot 65 that replaces cassette-type feeder 71 or cassette-type nozzle exchanging unit 11 is provided between feeder setting section 61 and stock section 63 of component mounter 55, it is possible to freely replace cassette-type nozzle exchanging unit 11 and cassette-type feeder 71 between feeder setting section 61 and stock section 63 using replacement robot 65 during operation of component mounter 55. Thus, it is possible to improve the operating ratio of component mounter 55.

Furthermore, in the first embodiment, since the configuration is such that the external height dimensions and depth dimensions of cassette-type nozzle exchanging unit 11 are the same as the external height dimensions and depth dimensions of cassette-type feeder 71, there is a merit in that it is possible to treat cassette-type nozzle exchanging unit 11 the same as cassette-type feeder 71 using the replacement robot 65. Thus, it is easy to place a mixture of both in feeder setting section 61.

Furthermore, in the first embodiment, the connector for communication and power which is connected to the connector for communication and power of component mounter 55 is provided in cassette case 72 of cassette-type feeder 71 and cassette case 12 of cassette-type nozzle exchanging unit 11. Accordingly, control signals and the like are transmitted and received between control device 92 of cassette-type feeder 71 or control device 45 of cassette-type nozzle exchanging unit 11 and the control device of component mounter 55, and each of the control devices 92, 45, and the like is electrified by both connectors being connected to each other. However, the communication of information or the supply of power is not limited to relying on the connection of connectors, and the communication of information or the supply of power may be performed in a contactless manner.

Also, in the first embodiment, the identification information reading section that reads the feeder ID or the nozzle exchanging unit ID from the identification information recording section of cassette-type feeder 71 or the identification information recording section of cassette-type nozzle exchanging unit 11 which is set in each of the slots is provided in stock section 63. However, the identification information reading section may be provided in replacement robot 65.

In the first embodiment, although one revolving nozzle station 13 is provided for one cassette-type nozzle exchanging unit 11, a plurality of revolving nozzle stations may be provided for one cassette-type nozzle exchanging unit 11.

Second Embodiment

Figure 9:
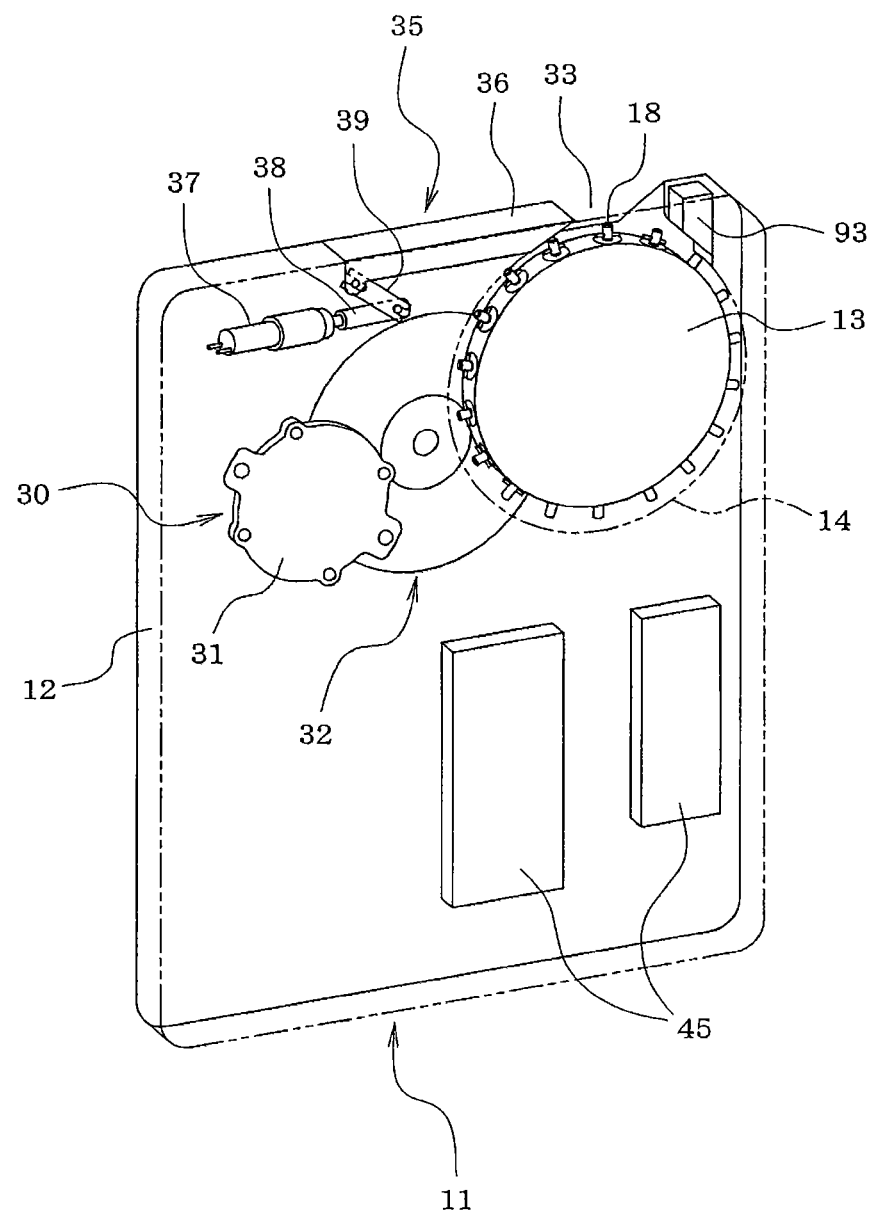
FIG. 9 is a perspective view illustrating a cassette-type nozzle exchanging unit of a second embodiment of the present disclosure.
Figure 10:
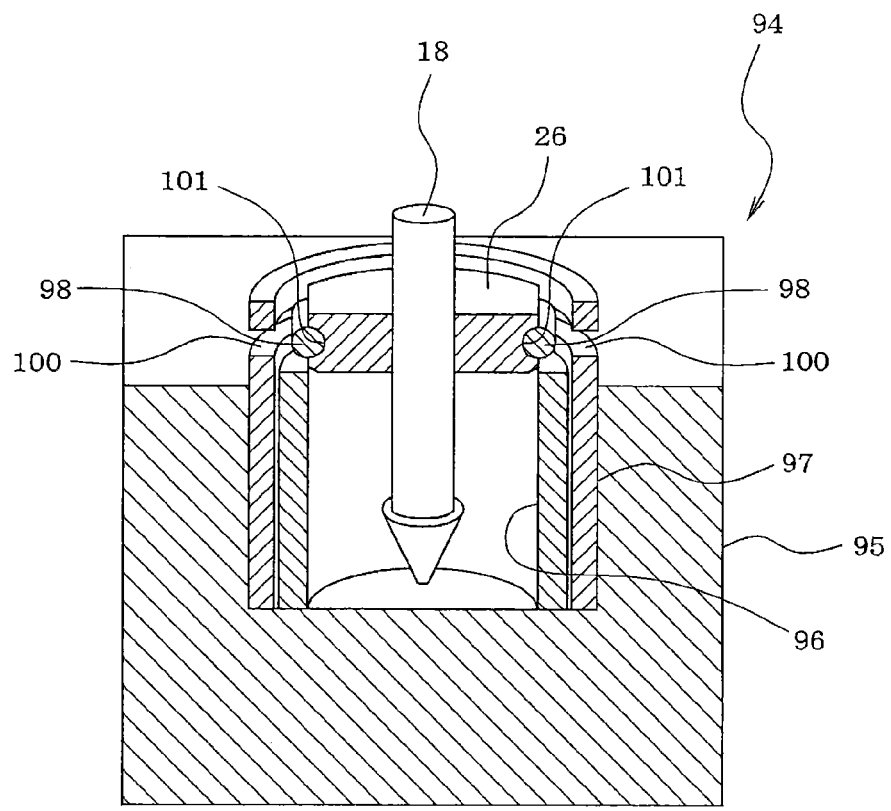
FIG. 10 is a perspective view illustrating a section of a nozzle holder of a revolving nozzle station of a third embodiment of the present disclosure.
Figure 11:
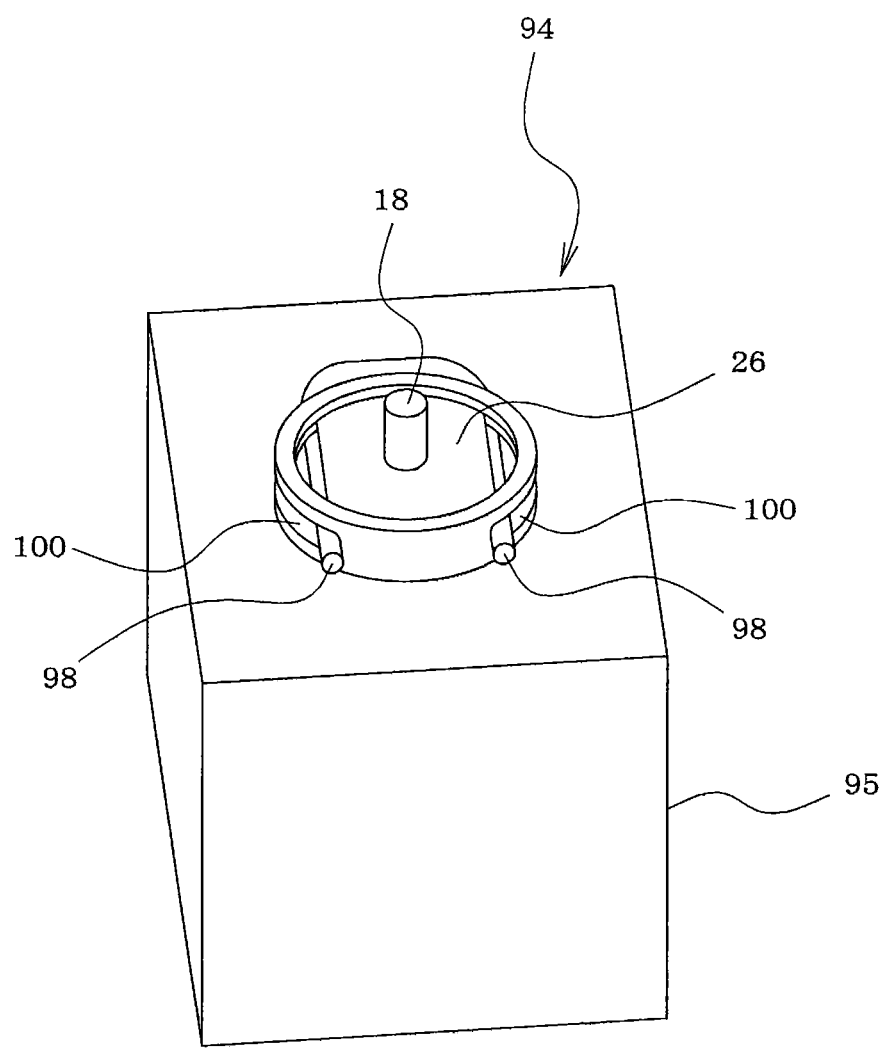
FIG. 11 is a perspective view illustrating a state in which the nozzle holder of the revolving nozzle station of the third embodiment is holding a nozzle.
Figure 12:
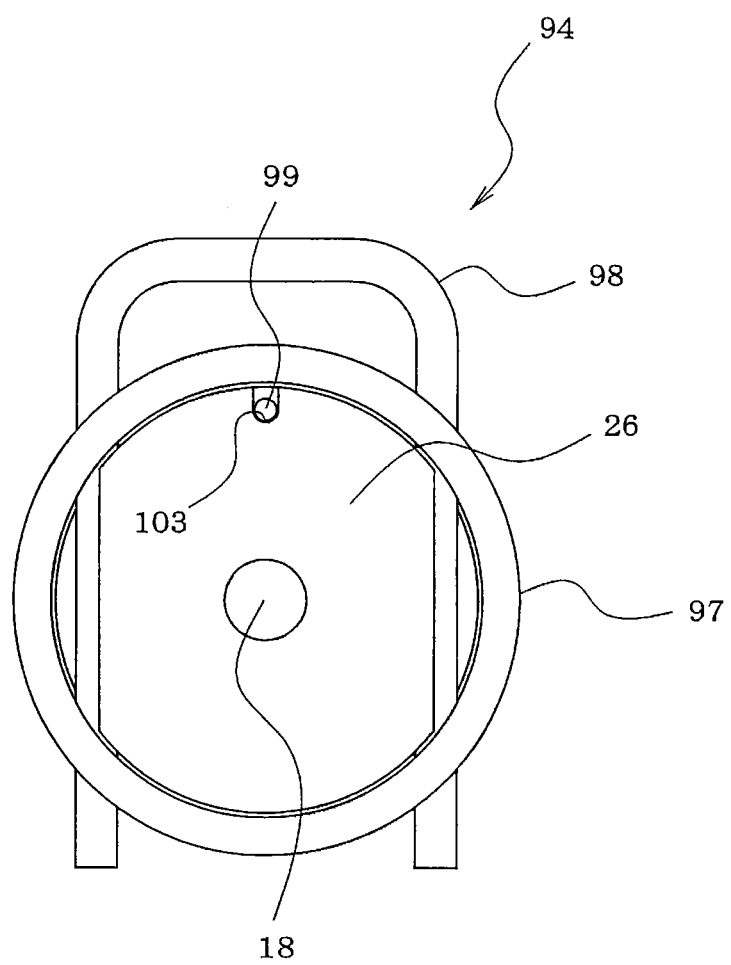
FIG. 12 is an enlarged partial plan view illustrating a state in which the nozzle holder of the revolving nozzle station of the third embodiment is holding the nozzle.
Figure 13:
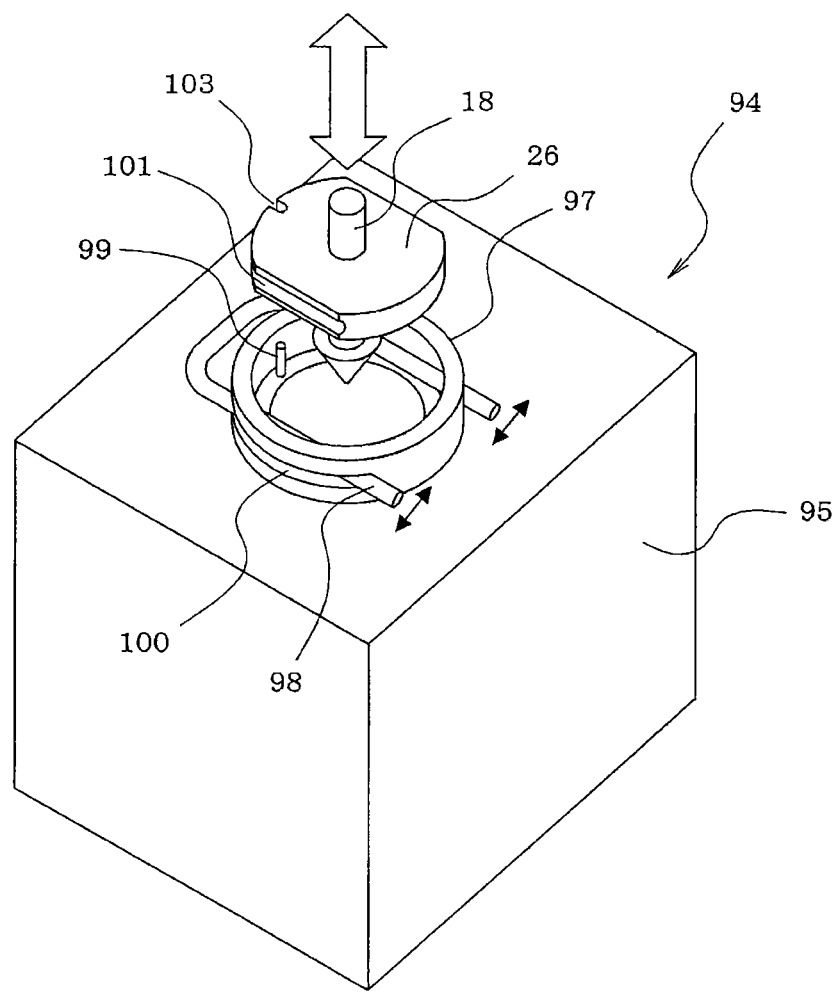
FIG. 13 is a perspective view illustrating a state when attaching/detaching the nozzle to/from the nozzle holder of the revolving nozzle station of the third embodiment.

In the first embodiment, a configuration is adopted in which reader 43 that reads the nozzle ID from nozzle identification information recording section 42 of nozzle 18 within cassette-type nozzle exchanging unit 11 is provided inside cassette case 12. However, in cassette-type nozzle exchanging unit 11 of a second embodiment of the present disclosure illustrated in FIG. 9, reader 93 (identification information reading device) that reads the nozzle ID from nozzle identification information recording section 42 of nozzle 18 is provided in the vicinity of nozzle exchange port 33 of cassette case 12. The nozzle ID is read, using reader 93, through nozzle exchange port 33 from nozzle identification information recording section 42 of, for example, the nozzle 18 which is two prior to the nozzle 18 which is to be held by mounting head 58 of component mounter 55. Other configurations are the same as the first embodiment.

With the second embodiment described above, it is possible to obtain the same effects as the first embodiment. Note that, the present disclosure is not limited to a configuration in which the reader which reads the nozzle ID from nozzle identification information recording section 42 of nozzle 18 is provided in cassette-type nozzle exchanging unit 11. A configuration may be adopted in which the reader described above is provided in mounting head 58 of component mounter 55, and the nozzle ID is read from nozzle identification information recording section 42 of the nozzle 18 which is positioned in nozzle exchange port 33 using the reader of mounting head 58. In this case, as the reader of mounting head 58, a bar-code reader which reads a bar-code of the nozzle ID, code data of a two-dimensional code, or the like using optical scanning may be used, or an antenna which reads the data of the nozzle ID which is stored on an electronic tag using wireless communication may be used. Alternatively, when a camera which images a reference position mark or the like of circuit board 60 is installed in mounting head 58, the nozzle ID may be identified by image processing using the camera as the identification information reading device.

Third Embodiment

Next, description will be given of a third embodiment of the present disclosure using FIG. 10 to FIG. 13. However, for portions which are effectively the same as in the first embodiment, the same symbols will be assigned and description will be omitted or simplified, and description will mainly be given of different portions.

In the third embodiment, the point in that an engaging system using a spring is adopted for the structure which holds nozzle 18 in nozzle holder 94 of revolving nozzle station 13 differs from the first embodiment. Holder case 95 of nozzle holder 94 of the third embodiment is fixed radially to the outer circumferential portion of revolving nozzle station 13, and nozzle retainer cylindrical section 96 and clamp cylindrical section 97 are provided superimposed on the inside and outside within holder case 95. The height of the top end of nozzle retainer cylindrical section 96 which is on the inside is lower than the height of the top end of clamp cylindrical section 97 which is on the outside, and positioning pin 99 is fixed facing upwards at a predetermined position (for example, a position on a center line of U-shaped engaging spring 98 which is described later) of the top end of the nozzle retainer cylindrical section 96 which is on the inside.

Spring fitting grooves 100 are formed in both sides of a portion which is higher than nozzle retainer cylindrical section 96 which is on the inside within the top portion of clamp cylindrical section 97 which is on the outside so as to partially cut into the clamp cylindrical section 97 in the circumferential direction, and U-shaped engaging spring 98 is assembled onto the top portion of clamp cylindrical section 97 which is on the outside by both side portions of U-shaped engaging spring 98 being fitted into spring fitting groove 100.

Correspondingly, engaging grooves 101 that engage with both sides of U-shaped engaging spring 98 are formed in both sides of flange 26 of nozzle 18, and a positioning recess 103 which fits positioning pin 99 is formed in a position corresponding to positioning pin 99 within the outer circumferential section of flange 26.

When causing nozzle holder 94 to hold nozzle 18, engaging grooves 101 of both sides of flange 26 of nozzle 18 are aligned with both sides of U-shaped engaging spring 98 of nozzle holder 94. In a state in which positioning recess 103 of flange 26 of nozzle 18 is aligned with positioning pin 99, flange 26 of nozzle 18 is pushed between both sides of U-shaped engaging spring 98, causing them to elastically deform in an opening direction. Engaging grooves 101 of both sides of flange 26 of nozzle 18 are fitted around both sides of U-shaped engaging spring 98 of nozzle holder 94, and positioning recess 103 of flange 26 of nozzle 18 is fitted around positioning pin 99. Accordingly, nozzle 18 is held by engagement with U-shaped engaging spring 98 in a state positioned in relation to nozzle holder 94 by positioning pin 99.

When removing nozzle 18 from nozzle holder 94, if nozzle 18 is pulled upward, both sides of U-shaped engaging spring 98 elastically deform in the opening direction due to the pulling force, the engagement is released, and nozzle 18 is removed from nozzle holder 94.

With the third embodiment described above, it is possible to obtain the same effects as the first embodiment.

Fourth Embodiment

Figure 14:
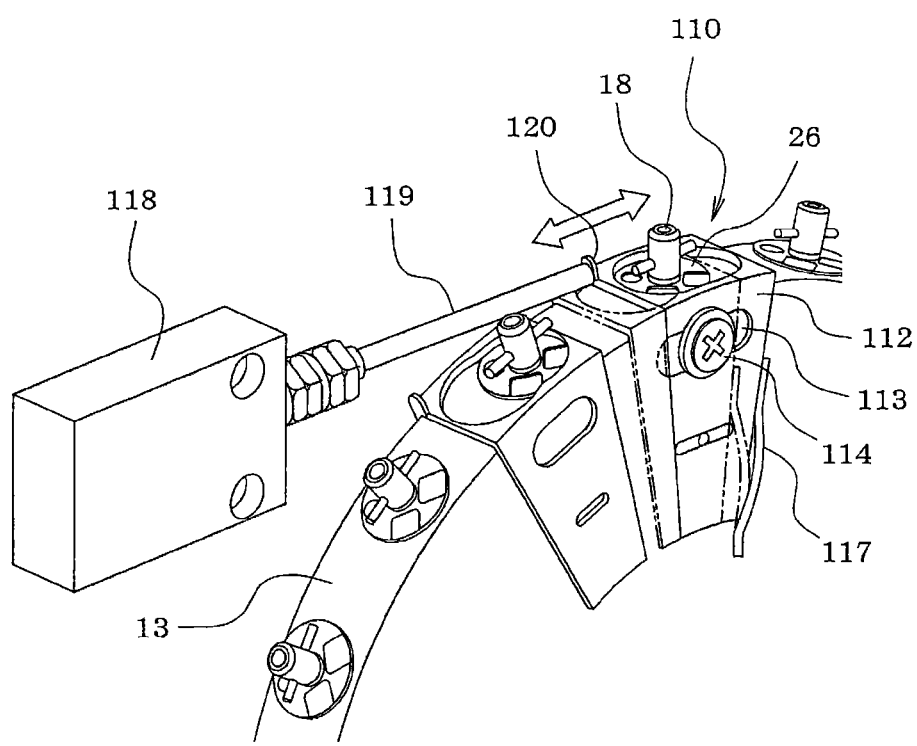
FIG. 14 is a perspective view illustrating a holding mechanism of a nozzle holder of a revolving nozzle station of a fourth embodiment of the present disclosure.
Figure 15:
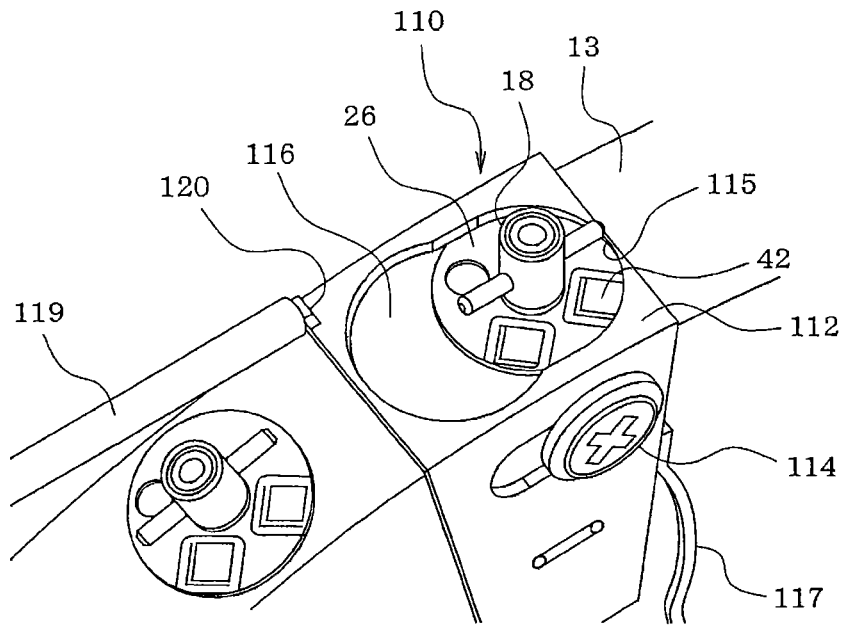
FIG. 15 is a perspective view illustrating a clamped state of the nozzle holder of the revolving nozzle station of the fourth embodiment.
Figure 16:
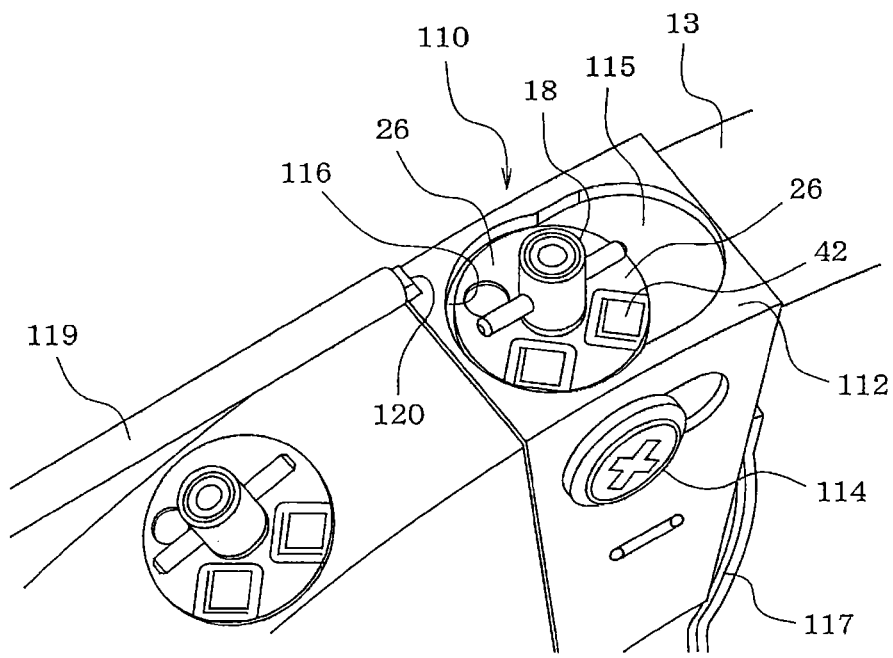
FIG. 16 is a perspective view illustrating an unclamped state of the nozzle holder of the revolving nozzle station of the fourth embodiment.

Next, description will be given of a fourth embodiment of the present disclosure using FIG. 14 to FIG. 16. However, for portions which are effectively the same as in the first embodiment, the same symbols will be assigned and description will be omitted or simplified, and description will mainly be given of different portions.

In the fourth embodiment, the point in that a shutter system is adopted for the structure which holds nozzle 18 in nozzle holder 110 of revolving nozzle station 13 differs from the first embodiment. In nozzle holder 110 of the fourth embodiment, clamp plate 112 which holds nozzle 18 is provided to be capable of sliding in the circumferential direction of revolving nozzle station 13. In this case, slide hole 113 of a predetermined length is formed in clamp plate 112, and by fixing a screw 114 which is inserted into slide hole 113 to nozzle holder 110, it is possible to slide clamp plate 112 between the clamped position illustrated in FIG. 15 and the unclamped position illustrated in FIG. 16.

Clamped hole 115 with a smaller diameter than the diameter of flange 26 of nozzle 18, and unclamped hole 116 with a larger diameter than the diameter of flange 26 are connectedly formed in clamp plate 112. When clamp plate 112 is slid to the clamped position illustrated in FIG. 15, clamped hole 115 of clamp plate 112 overlaps flange 26 of nozzle 18, such that nozzle 18 assumes a state of being clamped by clamp plate 112. Meanwhile, when clamp plate 112 is slid to the unclamped position illustrated in FIG. 16, unclamped hole 116 of clamp plate 112 matches flange 26 of nozzle 18, the clamping of nozzle 18 by clamp plate 112 is released, and nozzle 18 assumes a state of being removable through unclamped hole 116.

Spring 117 that biases clamp plate 112 in the direction of the clamped position is provided in nozzle holder 110. In contrast, cylinder 118, which drives clamp plate 112 in the direction of the unclamped position against the spring force of spring 117, is provided in cassette case 12 of cassette-type nozzle exchanging unit 11, and an end of rod 119 of cylinder 118 contacts raised part 120 of clamp plate 112 of the nozzle holder 110 which is positioned in nozzle exchange port 33 of cassette case 12. During non-operation (off-time) of cylinder 118, rod 119 is maintained in a retracted state, and clamp plate 112 of nozzle holder 110 is held in the clamped position by the spring force of spring 117. During operation (on-time) of cylinder 118, rod 119 protrudes and clamp plate 112 of nozzle holder 110 is caused to slide to the unclamped position against the spring force of spring 117.

Note that, the drive source of clamp plate 112 is not limited to cylinder 118, and another actuator (for example, a motor, a solenoid, or the like) may be used.

Fifth Embodiment

Next, description will be given of a fifth embodiment of the present disclosure using FIG. 17. However, for portions which are effectively the same as in the first embodiment, the same symbols will be assigned and description will be omitted or simplified, and description will mainly be given of different portions.

Figure 17:
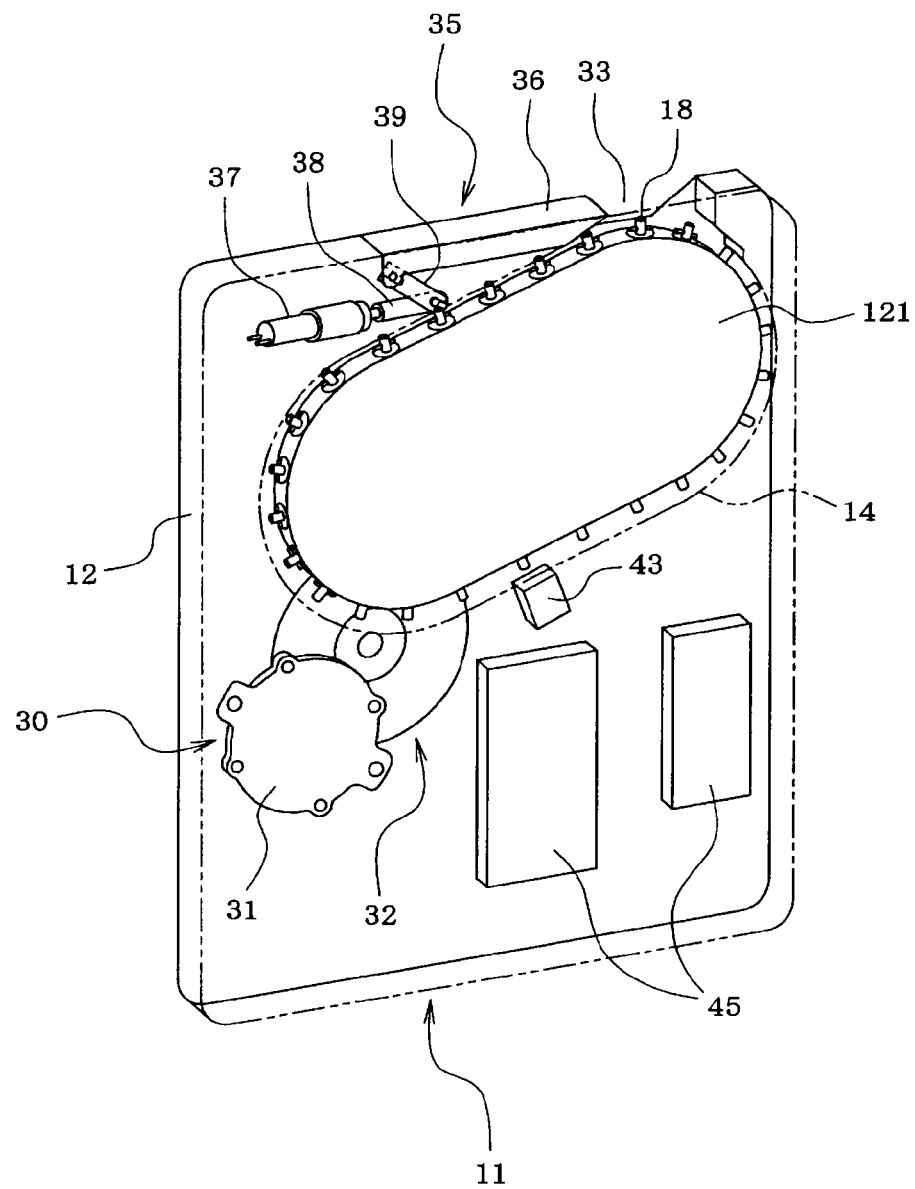
FIG. 17 is a perspective diagram illustrating a cassette-type nozzle exchanging unit of a fifth embodiment of the present disclosure.

Although the revolving nozzle station 13 of the first to fourth embodiments is a disc-shaped rotary nozzle station, in the fifth embodiment of the present disclosure illustrated in FIG. 17, an oblong or elongated circle revolving nozzle station 121 is revolved. In this case too, a link is created between the nozzle ID which is read by reader 43 and the revolution position of nozzle 18 and this information is stored in the memory of control device 45.

With the fifth embodiment, it is possible to obtain the same effects as the first embodiment. In addition, it goes without saying that the present disclosure is not limited to the first to fifth embodiments described above, and various embodiments with changes that do not extend beyond the scope of the disclosure are possible, such as the configuration of component mounter 55 and the configuration of replacement robot 65 may be modified as appropriate.

REFERENCE SIGNS LIST

11 . . . cassette-type nozzle exchanging unit, 12 . . . cassette case, 13 . . . revolving nozzle station, 14 . . . nozzle station loading section, 18 . . . nozzle, 19 . . . nozzle holder, 21 . . . nozzle retainer, 23 . . . positioning plate, 24 . . . clamp plate, 30 . . . revolving drive device, 31 . . . motor, 33 . . . nozzle exchange port, 35 . . . shutter mechanism, 36 . . . shutter plate, 37 . . . motor, 42 . . . nozzle identification information recording section, 43 . . . reader (identification information reading device), 45 . . . control device, 54 . . . replacement system, 55 . . . component mounter, 57 . . . conveyor, 58 . . . mounting head, 59 . . . XY movement mechanism, 60 . . . circuit board, 61 . . . feeder setting section, 62 . . . replacement area, 63 . . . stock section, 65 . . . replacement robot, 71 . . . cassette-type feeder, 72 . . . cassette case, 73 . . . component supply tape, 74 . . . tape reel, 75 . . . tape loading section, 76 . . . reel holding shaft, 78 . . . tape feed mechanism, 79 . . . top film peeling mechanism, 82 . . . sprocket, 85 . . . tape retainer, 86 . . . top film collection section, 87 . . . top film feed gear mechanism, 88 . . . motor, 92 . . . control device, 93 . . . reader (identification information reading device), 94 . . . nozzle holder, 98 . . . U-shaped engaging spring, 99 . . . positioning pin, 100 . . . spring fitting groove, 101 . . . engaging groove, 110 . . . nozzle holder, 112 . . . clamp plate, 115 . . . clamped hole, 116 . . . unclamped hole, 117 . . . spring, 118 . . . cylinder, 121 . . . revolving nozzle station.

The invention claimed is:
1. A cassette-type nozzle exchanging unit, comprising:
a revolving nozzle station holding multiple nozzles in a detachable manner arranged along a revolution path of the revolving nozzle station, the revolving nozzle station is configured to exchange a nozzle with a component mounter for picking up components supplied by a cassette-type component feeder which is set on a feeder setting section of the component mounter in a detachable manner;

a revolving drive device that causes the revolving nozzle station to revolve about a center thereof facing horizontally; and a cassette case that houses the revolving nozzle station and the revolving drive device inside the cassette case, wherein a nozzle exchange port is formed in a top surface of the cassette case, wherein the nozzle exchange port is configured to exchange one of the multiple nozzles of the revolving nozzle station with a mounting head of the component mounter through the nozzle exchange port, and wherein the cassette-type nozzle exchanging unit is configured to have similar dimensions to the cassette-type component feeder, said cassette-type component feeder detachably set in the feeder setting section of the component mounter, wherein the cassette-type nozzle exchanging unit is set on the feeder setting section of the component mounter next to the cassette-type component feeder or in place of the cassette-type component feeder such that a mixture of both cassette-type nozzle exchanging units and cassette-type component feeders can be set in the feeder setting section.

2. The cassette-type nozzle exchanging unit according to claim 1, provided with a shutter mechanism which opens and closes the nozzle exchange port.

3. The cassette-type nozzle exchanging unit according to claim 1, wherein a nozzle identification information recording section, in which identification information of the respective nozzle is recorded or stored, is provided on the multiple nozzles which are held in the revolving nozzle station, wherein an identification information reading device that reads the identification information from the nozzle identification information recording section of the nozzles is provided in the cassette case in a predetermined position on a path through which the nozzles which are held in the revolving nozzle station revolve, and wherein the cassette-type nozzle exchanging unit confirms the identification information of the nozzle which is positioned in the nozzle exchange port based on the identification information read by the identification information reading device and a revolution position of the revolving nozzle station.

4. The cassette-type nozzle exchanging unit according to claim 1, wherein a nozzle identification information recording section, in which identification information of the respective nozzle is recorded or stored, is provided on the multiple nozzles which are held in the revolving nozzle station, and wherein an identification information reading device, which reads the identification information from the nozzle identification information recording section of the nozzle that is positioned in the nozzle exchange port, is provided in the mounting head.

5. A replacement system of a cassette-type nozzle exchanging unit that replaces the cassette-type nozzle exchanging unit according to claim 1 which is set in the feeder setting section of the component mounter with a replacement cassette-type nozzle exchanging unit, the replacement system comprising:

a stock section that stores a replacement cassette-type feeder with which to replace a used cassette-type feeder which is set in the feeder setting section; and a replacement robot which removes the used cassette-type feeder from the feeder setting section and stores the used cassette-type feeder in the stock section, and removes the replacement cassette-type feeder from the stock section and sets the replacement cassette-type feeder in the feeder setting section, wherein a replacement cassette-type nozzle exchanging unit, which replaces a used cassette-type nozzle exchanging unit which is set in the feeder setting section, is stored in the stock section next to the replacement cassette-type feeder, and wherein the replacement robot removes the used cassette-type nozzle exchanging unit from the feeder setting section and stores the used cassette-type nozzle exchanging unit in the stock section, and removes the replacement cassette-type nozzle exchanging unit from the stock section and sets the replacement cassette-type nozzle exchanging unit in the feeder setting section.

6. The replacement system of a cassette-type nozzle exchanging unit according to claim 5, wherein the replacement robot removes the cassette-type nozzle exchanging unit from the feeder setting section and stores the cassette-type nozzle exchanging unit in the stock section during a period in which it is not necessary to perform nozzle exchange.

7. The replacement system of a cassette-type nozzle exchanging unit according to claim 5, wherein the cassette-type nozzle exchanging unit and the cassette-type feeder have the same external height dimensions and depth dimensions.

* * * * *